(12) United States Patent
Cheng et al.

(10) Patent No.: US 7,203,050 B2
(45) Date of Patent: Apr. 10, 2007

(54) NPN DARLINGTON ESD PROTECTION CIRCUIT

(75) Inventors: Tao Cheng, Hsin-Chu (TW); Ding-Jeng Yu, Hsin-Chu (TW)

(73) Assignee: Mediatek Inc., Hsin-Chu Hsien (TW)

( * ) Notice: Subject to any disclaimer, the term of this patent is extended or adjusted under 35 U.S.C. 154(b) by 283 days.

(21) Appl. No.: 10/604,354

(22) Filed: Jul. 14, 2003

(65) Prior Publication Data

US 2004/0114288 A1 Jun. 17, 2004

(30) Foreign Application Priority Data

Sep. 25, 2002 (TW) .................. 91127074 A

(51) Int. Cl.
*H02H 3/22* (2006.01)
(52) U.S. Cl. .................. 361/111; 327/432; 327/483
(58) Field of Classification Search .................. 361/11
See application file for complete search history.

(56) References Cited

U.S. PATENT DOCUMENTS

| | | | |
|---|---|---|---|
| 5,150,187 A | 9/1992 | Huang | 257/362 |
| 5,262,689 A * | 11/1993 | Glica et al. | 327/432 |
| 5,450,267 A * | 9/1995 | Diaz et al. | 361/56 |
| 5,463,520 A * | 10/1995 | Nelson | 361/56 |
| 5,485,027 A * | 1/1996 | Williams et al. | 257/343 |
| 5,640,299 A | 6/1997 | Leach | |
| 5,671,111 A * | 9/1997 | Chen | 361/56 |
| 5,748,425 A | 5/1998 | Gutsch et al. | |
| 5,790,460 A * | 8/1998 | Chen et al. | 365/185.29 |
| 5,986,863 A | 11/1999 | Oh | |
| 6,028,758 A | 2/2000 | Sharpe-Geisler | |
| 6,072,219 A * | 6/2000 | Ker et al. | 257/355 |
| 6,429,489 B1 | 8/2002 | Botula et al. | 257/355 |
| 6,496,055 B2 * | 12/2002 | Li | 327/536 |
| 6,549,061 B2 * | 4/2003 | Voldman et al. | 327/483 |

FOREIGN PATENT DOCUMENTS

| | | |
|---|---|---|
| EP | 0 561 451 A2 | 9/1993 |
| GB | 2 336 241 A | 10/1999 |

OTHER PUBLICATIONS

William D. Mack and Robert G. Meyer, "New ESD Protection Schemes for BiCMOS Processes With Application to Cellular Radio Designs", 1992 IEEE, pp. 2699-2702, U.S.A.

* cited by examiner

*Primary Examiner*—Brian Sircus
*Assistant Examiner*—Luis E. Román
(74) *Attorney, Agent, or Firm*—Winston Hsu

(57) ABSTRACT

An electrostatic discharge protection (ESD) circuit includes an NPN Darlington circuit and an n-type metal oxide semiconductor (NMOS) transistor. The drain of NMOS transistor is connected to the input end of the NPN Darlington circuit. The source of NMOS transistor is connected to the control end of the NPN Darlington circuit. The gate of NMOS transistor is connected to the output end of the NPN Darlington circuit.

10 Claims, 9 Drawing Sheets

NPN DARLINGTON ESD PROTECTION CIRCUIT

BACKGROUND OF INVENTION

1. Field of the Invention

The present invention relates to an electrostatic discharge protection circuit, and more particularly, to an NPN Darlington ESD protection circuit.

2. Description of the Prior Art

Static electricity is everywhere, because it is very possible to form static electricity by rubbing together any two bodies of different materials. When a body having static electricity touches metal pins of an IC, it will discharge high voltage to damage the internal circuit through the metal pins of the IC. Electrostatic discharge (ESD) will cause the electrical system to lose efficacy. When electrostatic discharge occurs, an electrostatic discharge protection circuit can act before a pulse of electrostatic discharge arrives at the internal circuit to eliminate the high voltage immediately and decrease the damage by the electrostatic discharge. Simultaneously, the protection circuit also has to sustain the energy of the electrostatic discharge and not damage itself. Additionally, the protection circuit acts only when electrostatic discharge occurs to prevent electrostatic discharge from influencing normal operations.

Please refer to FIG. 1. FIG. 1 is a schematic view of a BJT ESD protection circuit according to the prior art. As shown in FIG. 1, in a BiCMOS application, an NPN BJT is used as an ESD protection circuit. A base of the NPN BJT is floating, an emitter is grounded, and a collector is connected to an input pad or a VDD pad of an internal circuit. When the input pad or the VDD pad of the internal circuit is influenced by an electrostatic discharge, the NPN BJT operates in breakdown to ground current of the electrostatic discharge. The advantage of using the open-base NPN BJT as an ESD protection circuit is the small input capacitance of the NPN BJT. However, the NPN BJT has a current limitation such that the protection effect is poor, this being the shortcoming of using the open-base NPN BJT as the protection circuit.

Please refer to FIG. 2. FIG. 2 is a schematic view of a MOS ESD protection circuit according to the prior art. As shown in FIG. 2, a MOS is used as an ESD protection circuit. A gate of the MOS is connected to a source, the source is grounded, and a drain is connected to an input pad or a source pad of an internal circuit. When the input pad or the source pad of the internal circuit is influenced by an electrostatic discharge, the MOS turns on to ground current of the electrostatic discharge. The advantage of using a gate-grounded MOS as an ESD protection circuit is better ESD protection because the MOS is capable of handling a large current. However, the shortcoming of using gate-grounded MOS as an ESD protection circuit is that the MOS has a larger input capacitance, so the operation speed of the MOS is too slow in providing complete protection to the internal circuit.

According to the above-mentioned ESD protection circuits, using an open-base NPN BJT as an ESD protection circuit has a fast operation speed but a poor ESD protection effect, and using gate-grounded MOS as an ESD protection circuit has a better ESD protection effect but an operation speed that is limited because of the larger input capacitance.

For other related techniques please refer to U.S. Pat. Nos. 5,530,612, 5,986,863, 6,028,758, 6,320,735, and 6,400,540, U.S. filing Pat. No. 20020027755A1, and European Patent Numbers 651,490 and 477,429.

SUMMARY OF INVENTION

It is therefore a primary objective of the claimed invention to provide a NPN Darlington ESD protection circuit to solve the above-mentioned problems.

According to claimed invention, an electrostatic discharge protection (ESD) circuit includes an NPN Darlington circuit and an n-type metal oxide semiconductor (NMOS) transistor. A drain of the NMOS transistor is connected to an in-put end of the NPN Darlington circuit. A source of the NMOS transistor is connected to a control end of the NPN Darlington circuit. A gate of NMOS transistor is connected to an output end of the NPN Darlington circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
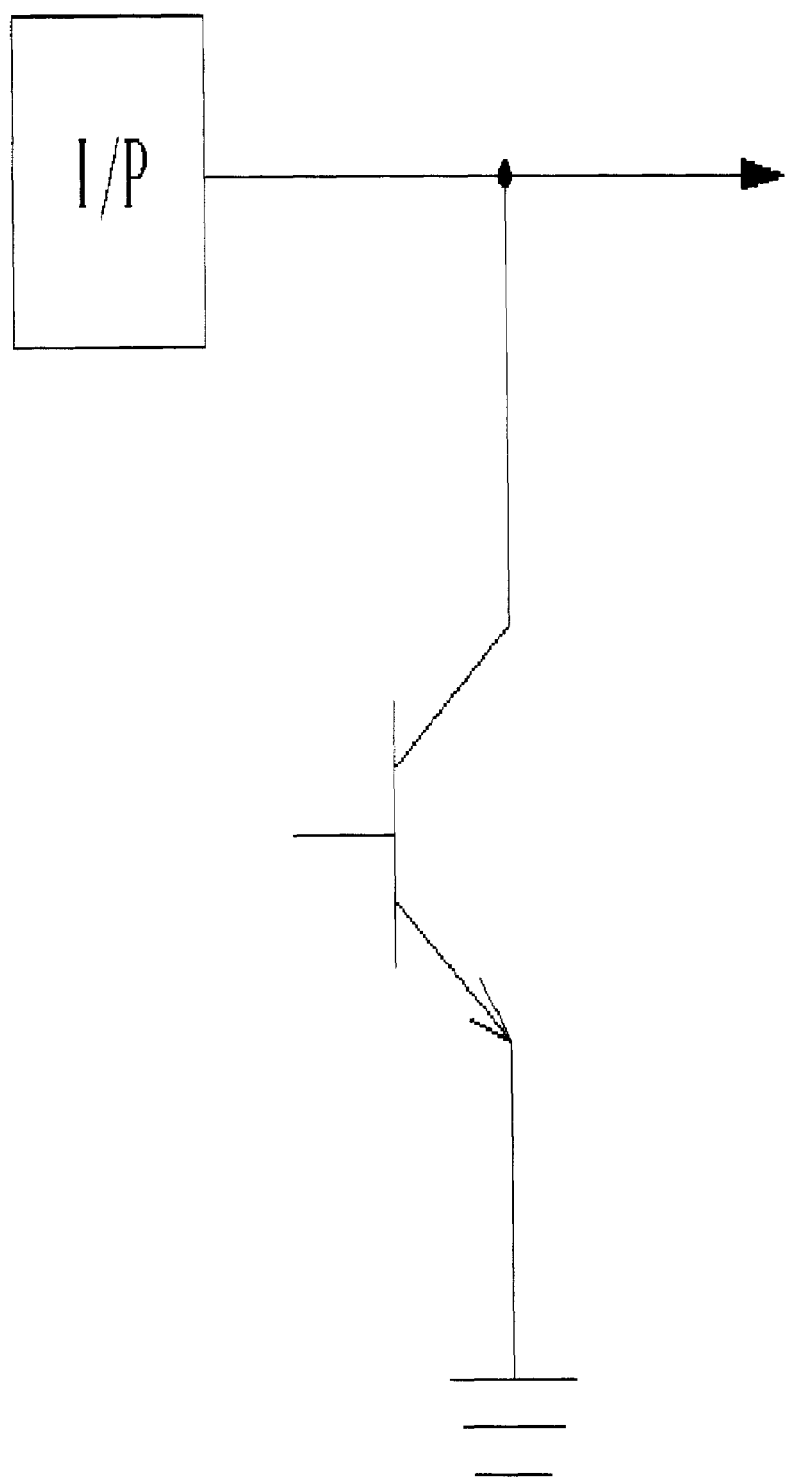
FIG. 1 is a schematic view of a BJT ESD protection circuit according to the prior art.
Figure 2:
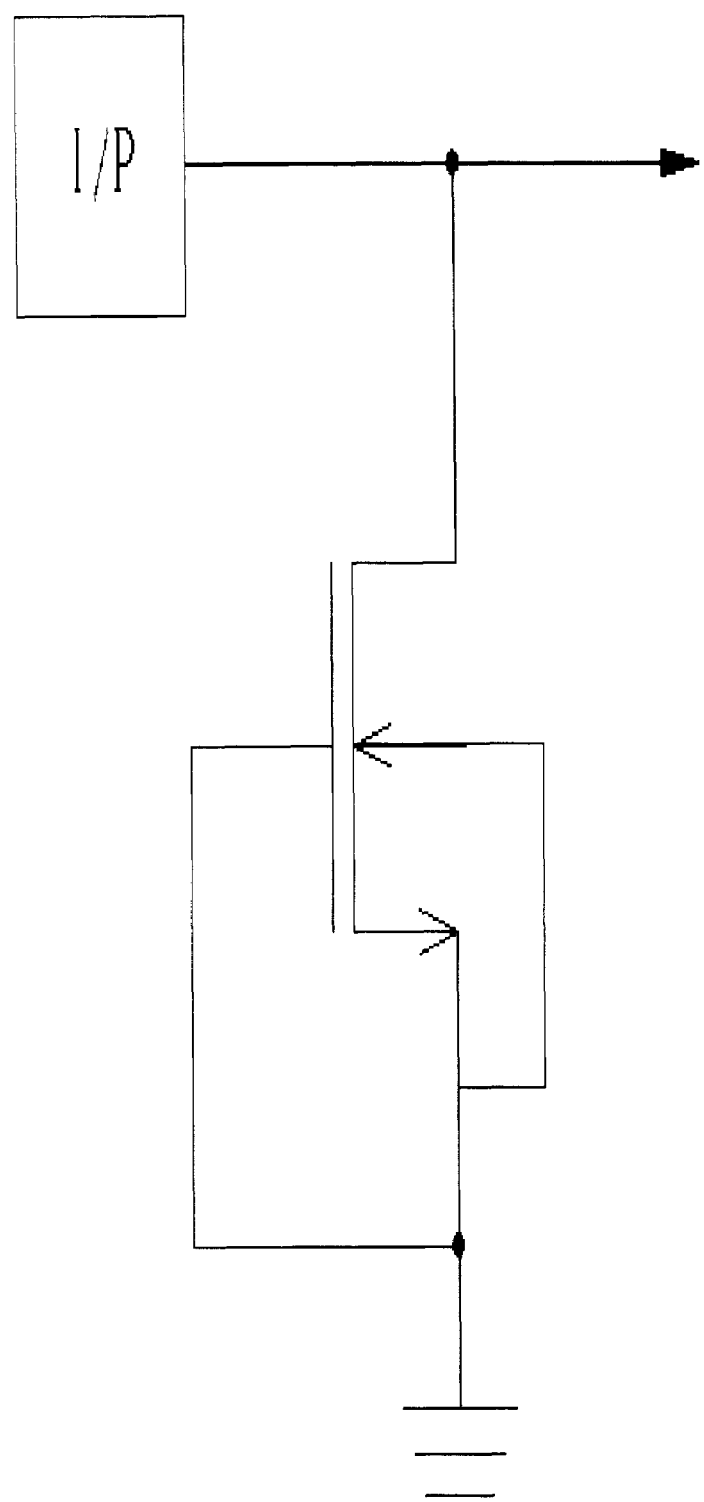
FIG. 2 is a schematic view of a MOS ESD protection circuit according to the prior art.
Figure 3:
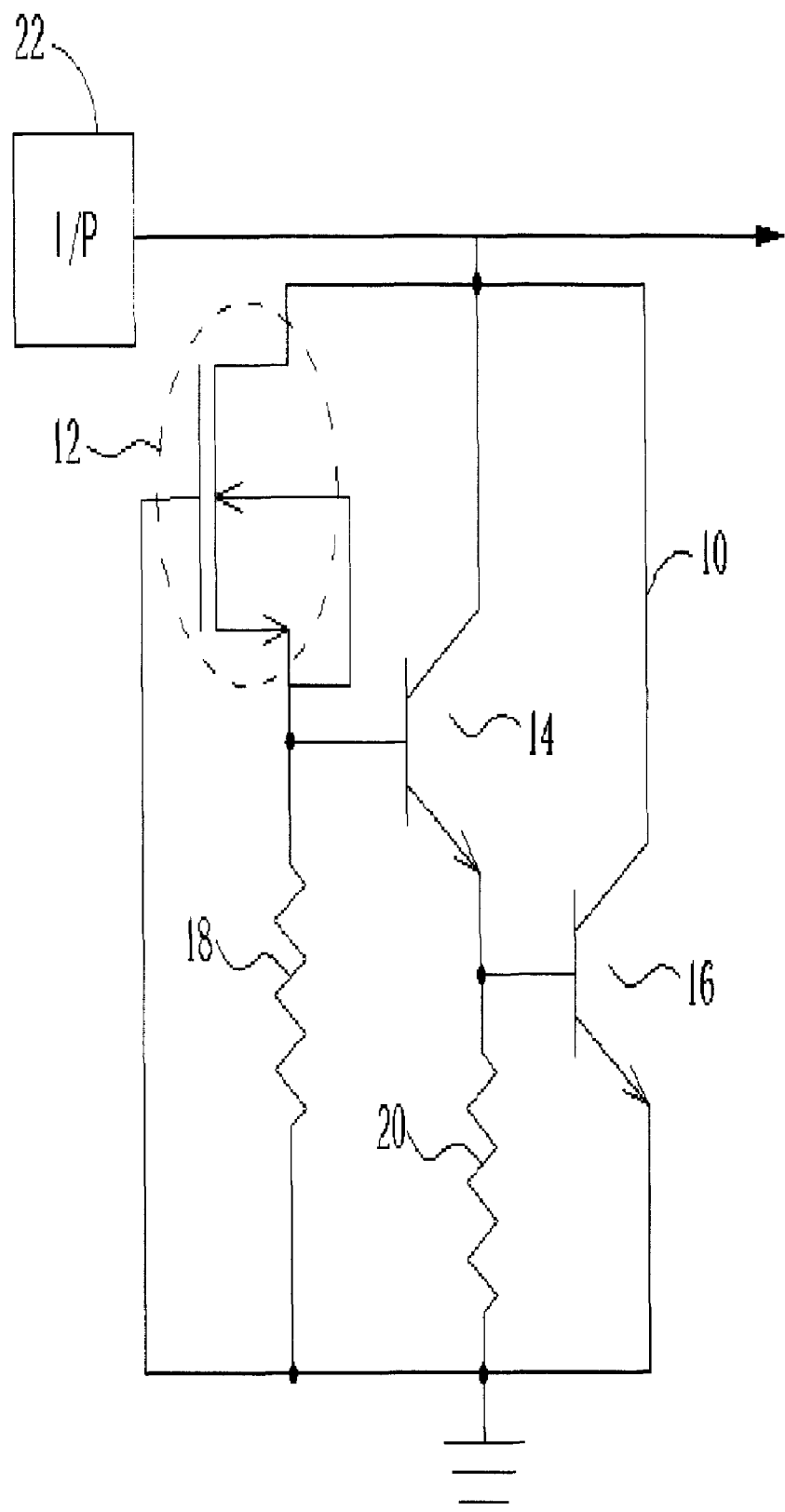
FIG. 3 is a schematic view of an ESD protection circuit according to the present invention.

Please refer to FIG. 3. FIG. 3 is a schematic view of an ESD protection circuit according to the present invention. The present invention ESD protection circuit 10 comprises an NMOS transistor 12, a first NPN BJT 14, a second NPN BJT 16, a first resistor 18 and a second resistor 20. The two collectors of the NPN BJT 14, 16 are connected together. The emitter of the first NPN BJT 14 is connected to the base of the second NPN BJT 16. The first NPN BJT 14 and the second NPN BJT 16 form a NPN Darlington circuit. The base of the first NPN BJT 14 is a control end of the NPN Darlington circuit, the collector of the first NPN BJT 14 is an input end of the NPN Darlington circuit, and the emitter of the second NPN BJT 16 is an output end of the NPN Darlington circuit. The drain of the NMOS transistor 12 is connected to the input end of the NPN Darlington circuit, the gate of the NMOS transistor 12 is connected to the output end of the NPN Darlington circuit, and the source of the NMOS transistor is connected to the control end of the NPN Darlington circuit. The input end of the NPN Darlington circuit is connected to an input pad 22 of an internal circuit, and the output end is connected to ground. The first resistor 18 is connected between the base of the first NPN BJT 14 and ground. The second resistor 20 is connected between the base of the second NPN BJT 16 and ground. When the input pad 22 of the internal circuit is influenced by an electrostatic discharge, the NMOS transistor 12 is triggered to turn on immediately so that the electrostatic current flows through the first resistor 18 forming a voltage drop. The voltage drop drives the first NPN BJT 14 to turn on so that the electrostatic current flows through the second resistor 20 forming another voltage drop. This voltage drop drives the second NPN BJT 16 to turn on to drive most electrostatic current through this loop to ground achieving the ESD protection. In this example, the emitter of the second NPN BJT 16 is designed with twice the width of the first NPN BJT 14 for achieving better ESD protection. The resistance values of the first resistor 18 and the second resistor 20 are chosen as 500 ohms for forming the voltage drops to turn on the NPN BJTs 14, 16. The width of the emitter of the first NPN BJT 14 and the second NPN BJT 16 and the resistances of the first resistor 18 and the second resistor 20 can be chosen according to practicability according to the present invention.

Figure 4A:
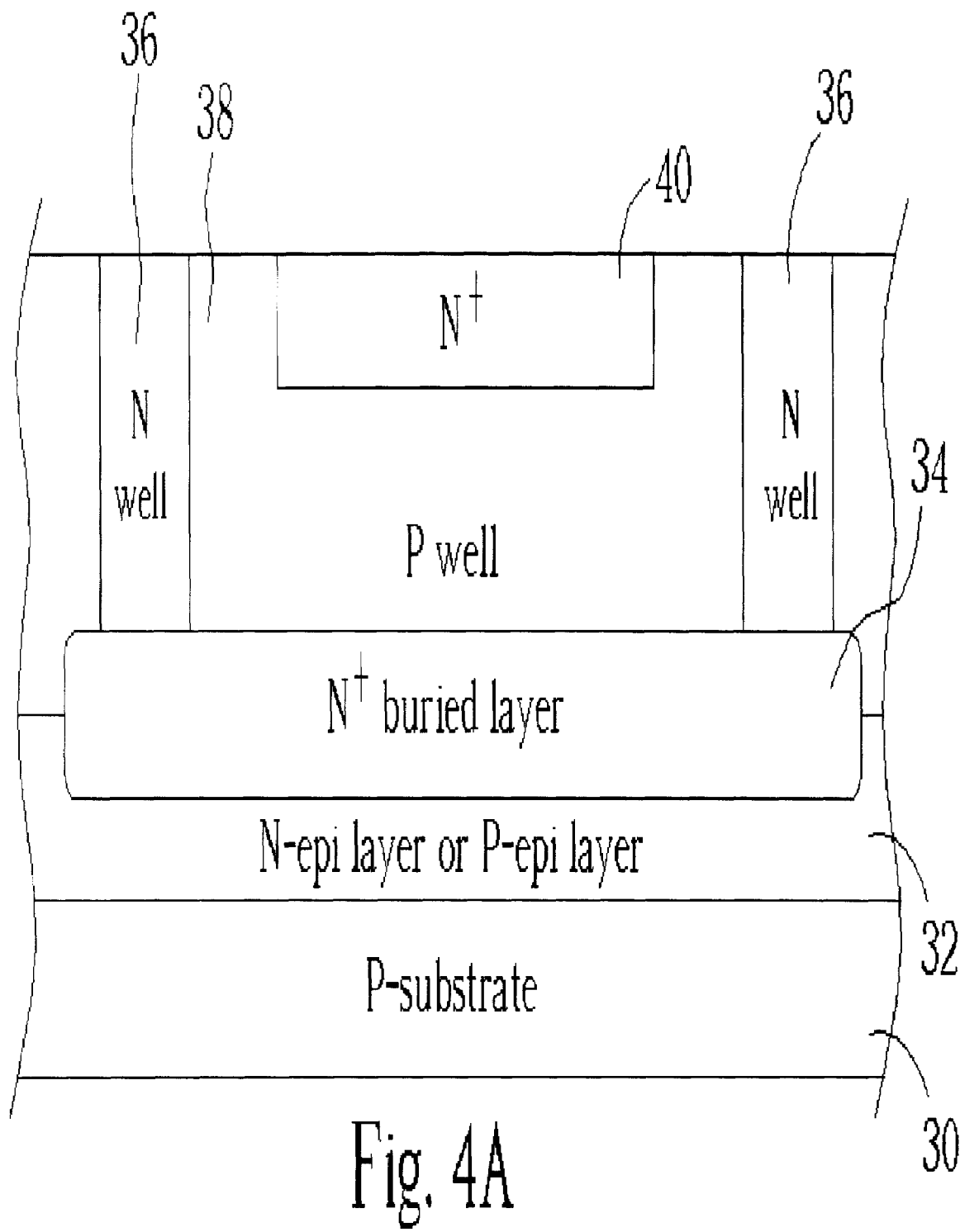
FIG. 4A and FIG. 4B are cross-sectional views of a BiCMOS structure of an ESD protection circuit according to the present invention.
Figure 4B:
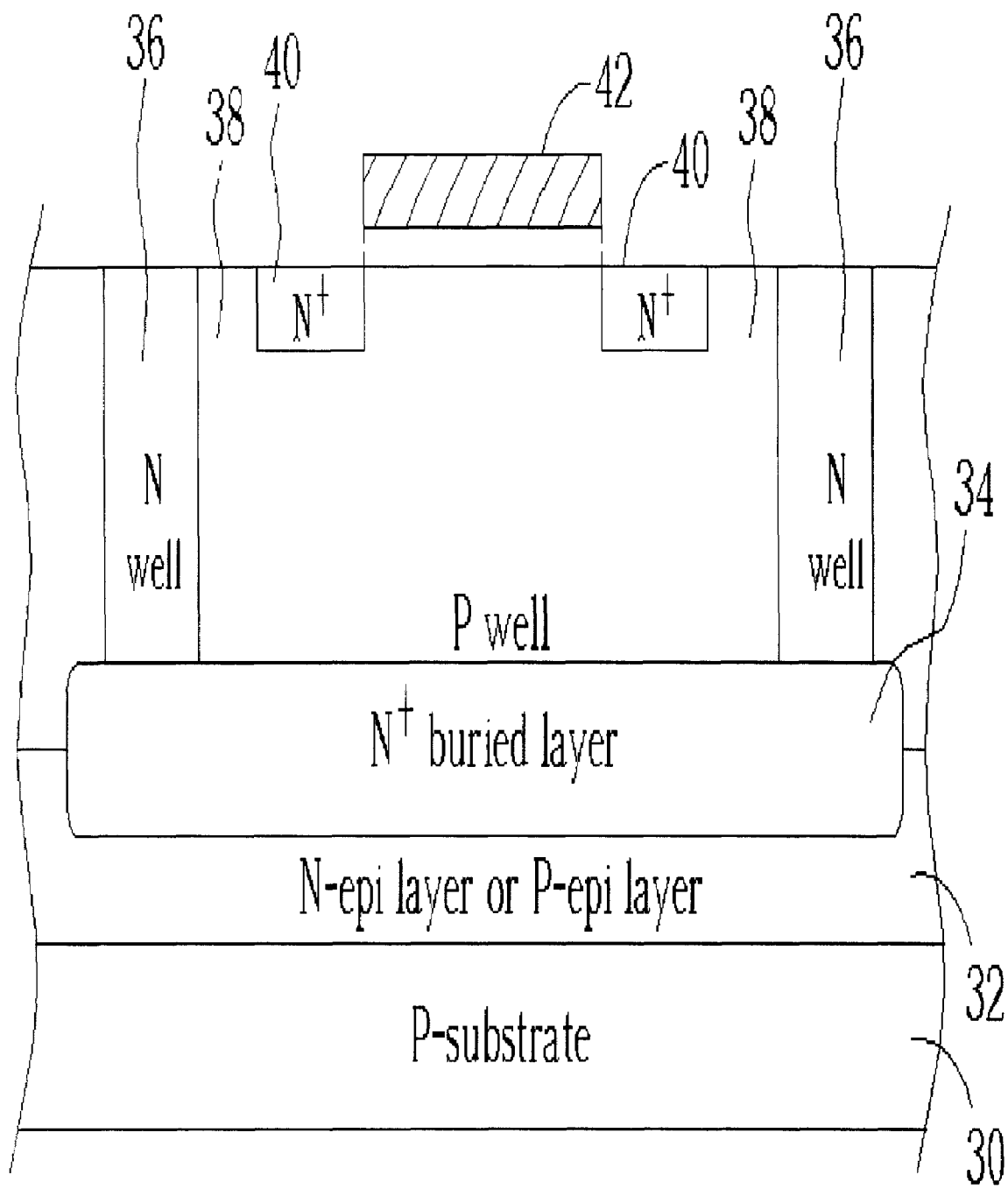

Please refer to FIG. 4A and FIG. 4B. FIG. 4A and FIG. 4B are cross-sectional views of a BiCMOS structure of an ESD protection circuit according to the present invention. As shown in FIG. 4A, in a BiCMOS process, a P-epi layer or an N-epi layer 32 is first formed on a P-substrate 30, then an N+ buried layer 34 is embedded in the epitaxial layer 32. A P well 38 is formed on the N+ buried layer 34, and a NW+ sink 36 is injected into a perimeter of the P well 38 on the N+ buried layer 34 to isolate the P well 38 and the P-substrate 30. Lastly, an N+ node 40 is embedded in the P well 38. In said structure according to the present invention, an NPN BJT uses the N+ node 40 as an emitter, the P well 38 as a base, and the N+ buried layer 34 as a collector, as shown in FIG. 4A. An NMOS transistor uses two N+ nodes 40 as a drain and a source, and an insulation layer 42 formed on the channel between the two N+ nodes 40 as a gate, as shown in FIG. 4B. The NMOS transistor in the P well 38 is isolated by the NW+ sink 36 and the N+ buried layer 34, represented by a circle in the NMOS transistor 12 shown in FIG. 3. Because of said specific isolated structure, the NPN Darlington circuit is capable of using the NMOS transistor as a trigger to achieve better ESD protection.

Figure 5A:
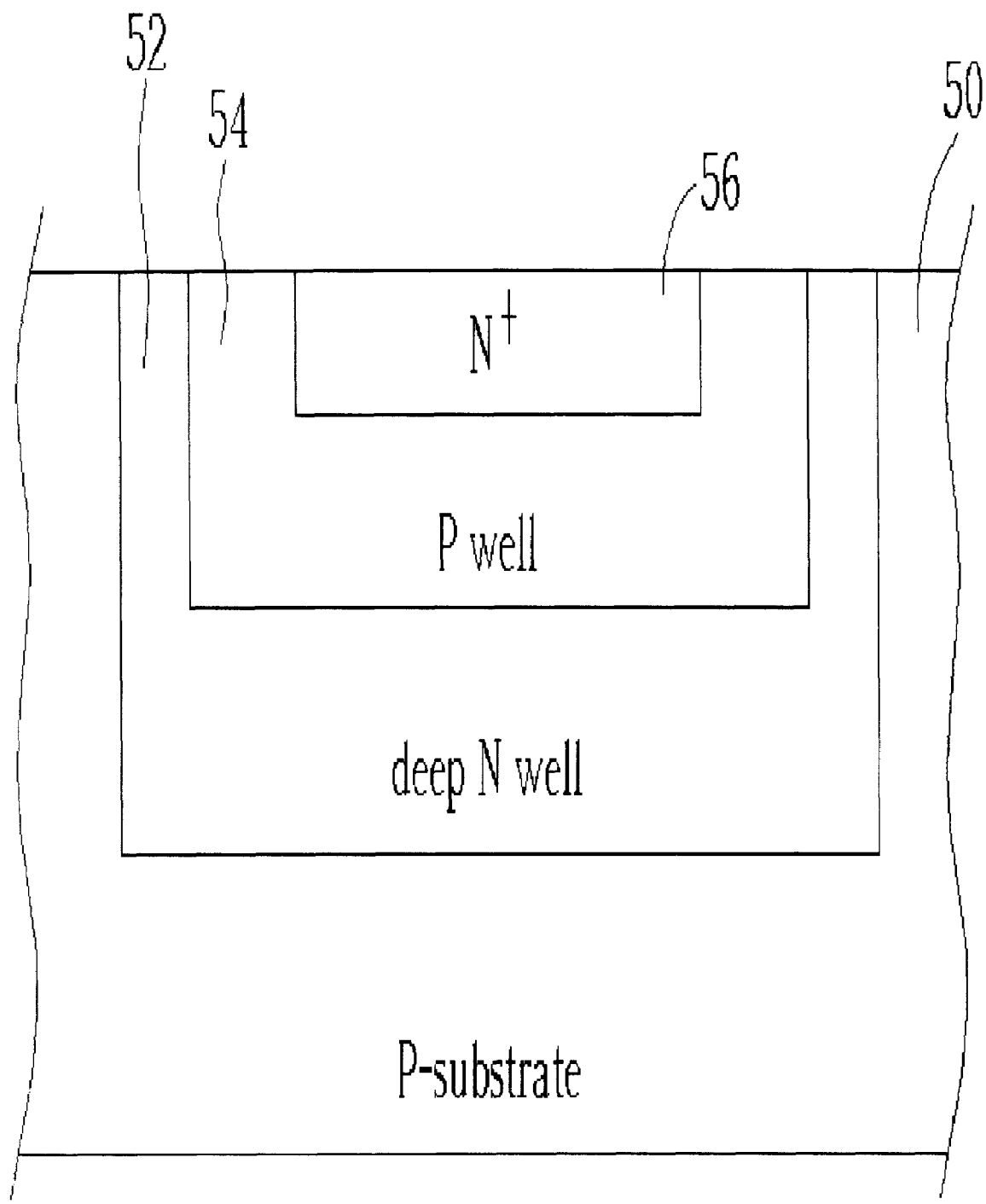
FIG. 5A and FIG. 5B are cross-sectional views of a CMOS structure of an ESD protection circuit according to the present invention.
Figure 5B:
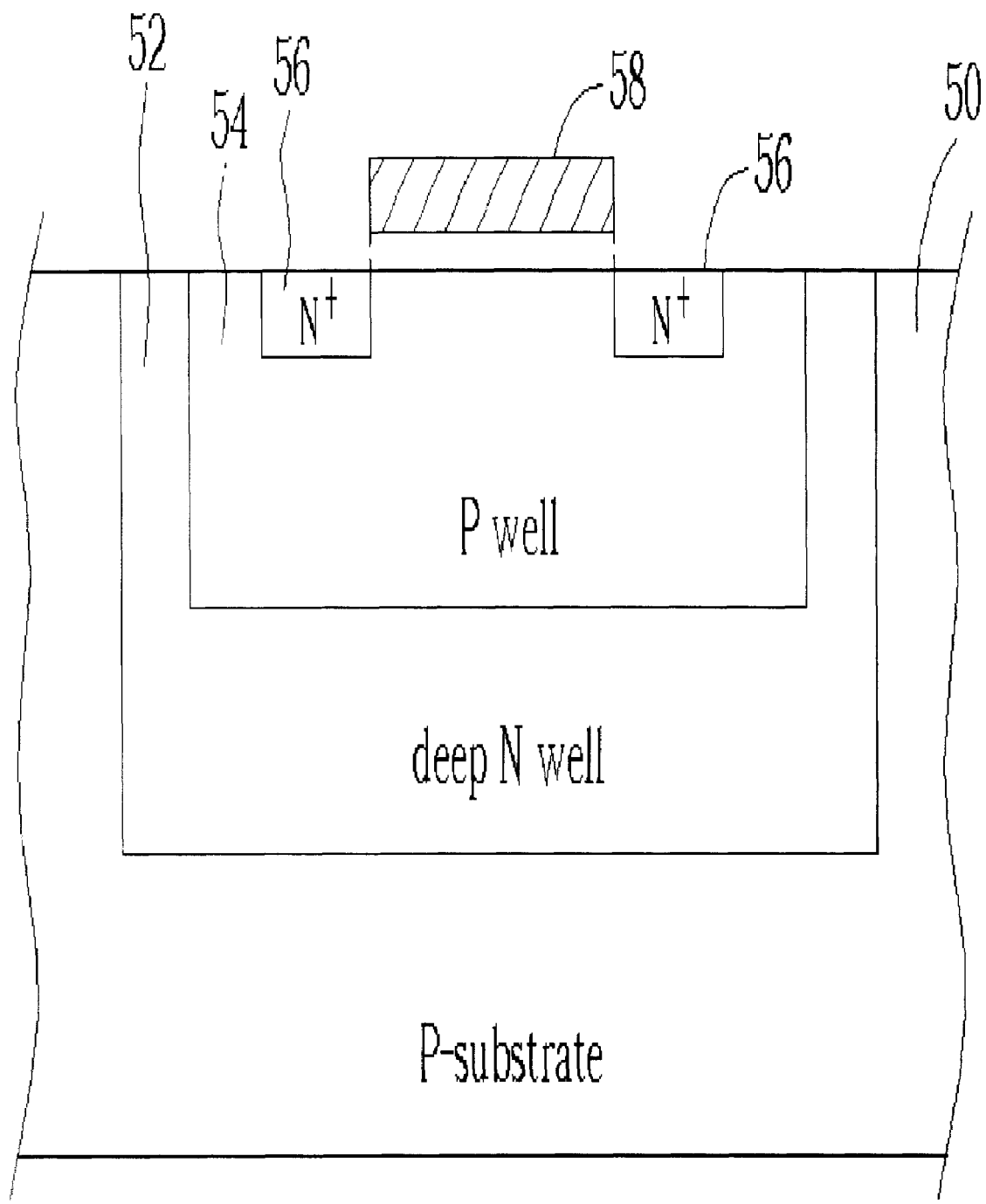

Please refer to FIG. 5A and FIG. 5B. FIG. 5A and FIG. 5B are cross-sectional views of a CMOS structure of an ESD protection circuit according to the present invention. Similarly, in a CMOS process a deep N well 52 is also utilized to isolate a P well 54 and a P-substrate 50. As shown in FIG. 5A, the deep N well 52 is first embedded in the P-substrate 50, then the P well 54 is embedded in the deep N well 52. Lastly, an N+ node 56 is embedded in the P well 54. An NPN BJT uses the N+ node 56 as an emitter, the P well as a base, and the deep N well as a collector, as shown in FIG. 5A. An NMOS transistor uses two N+ nodes 56 as a drain and a source, and an insulation layer 58 formed on the channel between the two N+ nodes 56 as a gate, as shown in FIG. 5B. The deep N well 52 isolates the NMOS transistor in the P well 54, represented by a circle in the NMOS transistor 12 shown in FIG. 3.

Figure 6:
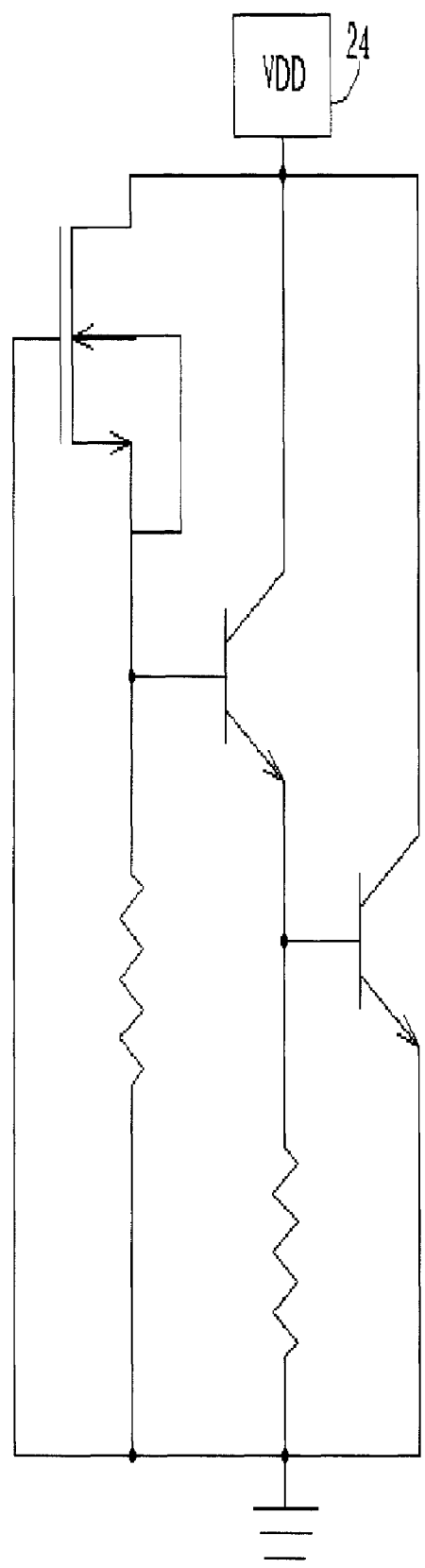
FIG. 6 is a schematic view of an ESD protection circuit connected a source pad according to the present invention.

Please refer to FIG. 6. FIG. 6 is a schematic view of an ESD protection circuit connected a source pad according to the present invention. For clear illustration, like elements in FIG. 3 and FIG. 6 have the same function and number. In FIG. 3, the input end of the NPN Darlington circuit is connected to the input pad 22 of the internal circuit. When the input pad 22 of the internal circuit is influenced by electrostatic discharge, the ESD protection circuit 10 turns on to ground the electrostatic current. Similarly, the input end of the NPN Darlington circuit of the ESD protection circuit 10 is also capable of being connected to a source pad 24. When the source pad 24 is influenced by an electrostatic discharge, the ESD protection circuit 10 turns on to ground the electrostatic current. In general, a human-body model (HBM) and a machine model (MM) are used to simulate the electrostatic discharge. The effect of ESD protection is estimated by measuring values of the HBM or MM, and a large value of the HBM and MM indicates better ESD protection. When an ESD protection circuit is connected to an input pad of an internal circuit, the HBM value of the prior art is 2.5 KV and the MM value is 200 V, however, the HBM value of the present invention is 5.5 KV and the MM value is 500 V. When an ESD protection circuit is connected to a source pad of an internal circuit, the HBM value of the prior art is 5 KV and the MM value is 200 V, however, the HBM value of the present invention is 5 KV and the MM value is 400 V. According to said data, the ESD protection circuit 10 will protect a circuit from electrostatic discharge effectively.

Figure 7:
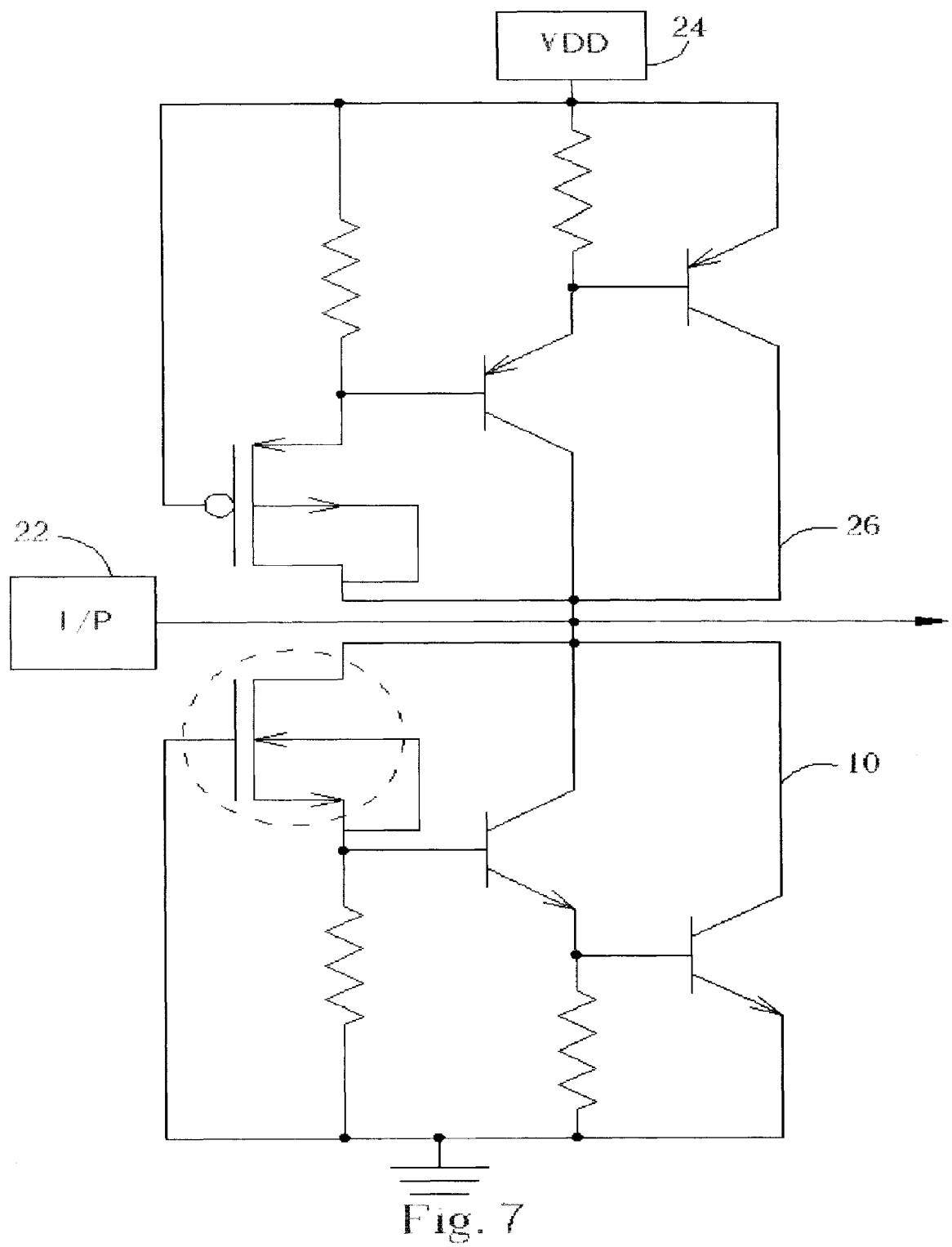
FIG. 7 is a schematic view of a complementary ESD protection circuit according to the present invention.

Please refer to FIG. 7. FIG. 7 is a schematic view of a complementary ESD protection circuit according to the present invention. In FIG. 3, if the source receives an electrostatic discharge pulse, the electrostatic current has to flow to the input pad 22 of the internal circuit through ground and the effect of the ESD protection may not satisfy higher requests. As shown in FIG. 7, a circuit 26 completely complementary to the ESD protection circuit 10 in FIG. 3 composed of PNP BJTs and a PMOS transistor is added between the source and the input pad 22 of the internal circuit. If the source receives an electrostatic discharge, the electrostatic current flows to the input pad 22 of the internal circuit through the circuit 26 directly to enhance the effect of ESD protection.

In contrast to the prior art, the ESD protection circuit 10 according to the present invention uses an N well 36 and an N+ buried layer 34 to isolate the NMOS transistor in the P well 38 in a BiCMOS application, and uses a deep N well 52 to isolate the NMOS transistor in the P well 54 in a CMOS application. Because of said isolation technique, the NPN Darlington circuit composed of the NPN BJTs 14, 16 is capable of using the NMOS transistor 12 as a trigger to drive the NPN Darlington circuit to ground the electrostatic current so that ESD protection is better. Experimentation has confirmed that the ESD protection circuit according to present invention is more effective than the prior art no matter the protection circuit connects to the source pad or the input pad of the internal circuit.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An electrostatic discharge protection circuit comprising:
   an npn Darlington circuit comprising an input end and an output end; and
   an N-type channel metal-oxide semiconductor (NMOS) transistor, a drain of the NMOS transistor connected to the input end of the npn Darlington circuit, a source of the NMOS transistor connected to a control end of the npn Darlington circuit, a gate of the NMOS transistor connected to the output end of the npn Darlington circuit;
   wherein the npn Darlington circuit further comprises two npn-type bipolar junction transistors (BJTs), each npn BJT comprising an N+ buried layer, a P well formed on the N+ buried layer, an N well formed on the N+ buried layer around the P well, and an N+ node formed in a top side of the P well; and the NMOS transistor comprises an N+ buried layer, a P well formed on the N+ buried layer, an N well formed on the N+ buried layer around the P well, and two N+ nodes formed in a top side of the P well;

the two BJTs and the NMOS transistor are formed on a P-substrate, and the N wells of the two npn BJTs and the NMOS transistor are used to isolate the P wells and the P-substrate; and further comprising a P-epi layer formed on the P-substrate, and wherein the N wells of the two npn BJTs and the NMOS transistor are formed on the P-epi layer.

2. The electrostatic discharge protection circuit of claim 1 wherein the circuit is manufactured by a BiCMOS process.

3. The electrostatic discharge protection circuit of claim 1 wherein the input end of the npn Darlington circuit is connected to an input end of another circuit.

4. The electrostatic discharge protection circuit of claim 1 wherein the input end of the npn Darlington circuit is connected to a voltage source.

5. The electrostatic discharge protection circuit of claim 1 further comprising:
a pnp Darlington circuit, an input end of the pnp Darlington circuit connected to the input end of the npn Darlington circuit, an output end of the pnp Darlington circuit connected to a voltage source; and
a P-type channel metal-oxide semiconductor (PMOS) transistor, a drain of the PMOS transistor connected to the input end of the pnp Darlington circuit, a source of the PMOS transistor connected to a control end of the pnp Darlington circuit, a gate of the PMOS transistor connected to the output end of the pnp Darlington circuit.

6. An electrostatic discharge protection circuit comprising:
an npn Darlington circuit comprising an input end and an output end; and
an N-type channel metal-oxide semiconductor (NMOS) transistor, a drain of the NMOS transistor connected to the input end of the npn Darlington circuit, a source of the NMOS transistor connected to a control end of the npn Darlington circuit, a gate of the NMOS transistor connected to the output end of the npn Darlington circuit;

wherein the npn Darlington circuit further comprises two npn-type bipolar junction transistors (BJTs), each npn BJT comprising an N+ buried layer, a P well formed on the N+ buried layer, an N well formed on the N+ buried layer around the P well, and an N+ node formed in a top side of the P well; and the NMOS transistor comprises an N+ buried layer, a P well formed on the N+ buried layers, an N well formed on the N+ buried layer around the P well, and two N+ nodes formed in a top side of the P well;

the two BJTs and the NMOS transistor are formed on a P-substrate, and the N wells of the two npn BJTs and the NMOS transistor are used to isolate the P wells and the P-substrate; and further comprising an N-epi layer formed on the P-substrate, and the N wells of the two npn BJTs and the NMOS transistor are formed on the N-epi layer.

7. The electrostatic discharge protection circuit of claim 6 wherein the circuit is manufactured by a BiCMOS process.

8. The electrostatic discharge protection circuit of claim 6 wherein the input end of the npn Darlington circuit is connected to an input end of another circuit.

9. The electrostatic discharge protection circuit of claim 6 wherein the input end of the npn Darlington circuit is connected to a voltage source.

10. The electrostatic discharge protection circuit of claim 6 further comprising: a pnp Darlington circuit, an input end of the pnp Darlington circuit connected to the input end of the npn Darlington circuit, an output end of the pnp Darlington circuit connected to a voltage source; and a P-type channel metal-oxide semiconductor (PMOS) transistor, a drain of the PMOS transistor connected to the input end of the pnp Darlington circuit, a source of the PMOS transistor connected to a control end of the pnp Darlington circuit, a gate of the PMOS transistor connected to the output end of the pnp Darlington circuit.

* * * * *

UNITED STATES PATENT AND TRADEMARK OFFICE
CERTIFICATE OF CORRECTION

PATENT NO. : 7,203,050 B2  Page 1 of 1
APPLICATION NO. : 10/604354
DATED : April 10, 2007
INVENTOR(S) : Tao Cheng et al.

It is certified that error appears in the above-identified patent and that said Letters Patent is hereby corrected as shown below:

On the title page, item (30), correct the application number of the Foreign Application Priority Data from "91127074 A" to --"91122074 A"--

Signed and Sealed this

Twenty-sixth Day of June, 2007

JON W. DUDAS
*Director of the United States Patent and Trademark Office*